United States Patent
Dong

(10) Patent No.: US 7,691,721 B2
(45) Date of Patent: Apr. 6, 2010

(54) METHOD FOR MANUFACTURING FLASH MEMORY DEVICE

(75) Inventor: Cha Deok Dong, Kyungki-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 594 days.

(21) Appl. No.: 11/146,169

(22) Filed: Jun. 6, 2005

(65) Prior Publication Data

US 2006/0057806 A1 Mar. 16, 2006

(30) Foreign Application Priority Data

Sep. 10, 2004 (KR) ................... 10-2004-0072497

(51) Int. Cl.
*H01L 21/762* (2006.01)
(52) U.S. Cl. .................. 438/425; 438/426; 257/E21.55
(58) Field of Classification Search .............. 438/257, 438/425
See application file for complete search history.

(56) References Cited

U.S. PATENT DOCUMENTS

| | | | | |
|---|---|---|---|---|
| 5,468,676 A | * | 11/1995 | Madan | 438/426 |
| 5,721,174 A | * | 2/1998 | Peidous | 438/445 |
| 5,910,018 A | * | 6/1999 | Jang | 438/425 |
| 6,033,969 A | * | 3/2000 | Yoo et al. | 438/425 |
| 6,124,184 A | * | 9/2000 | Jeong | 438/435 |
| 6,261,905 B1 | * | 7/2001 | Chen et al. | 438/264 |
| 6,495,430 B1 | * | 12/2002 | Tsai et al. | 438/424 |
| 6,869,849 B2 | * | 3/2005 | Kanamori | 438/296 |
| 2003/0119255 A1 | * | 6/2003 | Dong et al. | 438/257 |
| 2004/0164344 A1 | * | 8/2004 | Weimer | 257/321 |
| 2005/0221558 A1 | * | 10/2005 | Lee | 438/257 |

FOREIGN PATENT DOCUMENTS

| KR | 2004-0002233 | 1/2004 |
|---|---|---|
| KR | 2005-0009490 | 1/2005 |

OTHER PUBLICATIONS

Huang, Improving radiation hardness of EEPROM/Flash cell by N2O annealing, IEEE, 19, 1998, pp. 256-258.*

* cited by examiner

*Primary Examiner*—Sue Purvis
*Assistant Examiner*—Benjamin P Sandvik
(74) *Attorney, Agent, or Firm*—Marshall, Gerstein & Borun LLP

(57) ABSTRACT

Provided is a method for manufacturing a flash memory device, in which an oxidation process is carried out on the disclosed top surface of a semiconductor substrate to form a surface oxide film in the form of bird's beak with an appropriate width before conducting an etching process for trench. Thus, the present invention prevents the effect of thinning tunnel oxide film while reducing a critical dimension of an active region. And, it is possible to assure a normal cell operation by the Fowler-Nordheim (FN) tunneling effect owing to preventing the thinning tunnel oxide film.

10 Claims, 5 Drawing Sheets

METHOD FOR MANUFACTURING FLASH MEMORY DEVICE

BACKGROUND

1. Field of the Invention

The present invention relates to a method for manufacturing a flash memory device and specifically, to a method for manufacturing a flash memory device, which improves an operational characteristic of a memory cell by preventing the effect that a tunnel oxide film is formed thinner at top corners of a trench than in an active region while forming a field isolation film with a conventional shallow trench isolation (STI) process.

2. Discussion of Related Art

In fabricating a flash memory device, it is general to form a field isolation film by means of a self aligned shallow trench isolation (SA-STI) process. But, with the trends of higher integration density for flash memory devices, the technique of SA-STI becomes no more effective under the dimension of sub micron scheme. That is, it would be inevitable, under the sub micron dimension, to employ a typical shallow trench isolation (STI) technique that conducts an etching process (hereinafter, referred to as 'trench etching process') to form trenches in the structure including oxide and nitride films.

However, since the STI process forms a tunnel oxide film after forming a trench in first, there is a problem that a profile of the tunnel oxide film is affected from a profile of top corners of the trench. In general, as shown in FIG. 12, a part of the tunnel oxide film is formed thinner at the top corners of the trench, rather than the other part of the tunnel oxide film in an active region, because an oxidation rate is reduced due to plasma damages during an oxidation process to form the tunnel oxide film. As a result, it becomes difficult to accomplish a normal cell operation.

SUMMARY OF THE INVENTION

The present invention is directed to solve the problem, providing a method for manufacturing a flash memory device, which improves an operational characteristic of a memory cell by preventing the effect that a tunnel oxide film is formed thinner at top corners of a trench than in an active region while forming a field isolation film with a conventional shallow trench isolation (STI) process.

An aspect the present invention is to provide a method for manufacturing a flash memory device, the method comprising the steps of: providing a semiconductor where a screen oxide film is formed; forming a pad nitride film on the screen oxide film; patterning the pad nitride film and the screen oxide film to partially disclose the semiconductor substrate; forming a spacer on sidewalls of the patterned pad nitride and screen oxide films; oxidizing the semiconductor substrate disclosed by the spacers, forming a surface oxide film on the disclosed top surface of the semiconductor substrate and under the spacers; etching the spacers with the spacers as a mask, forming a trench in the semiconductor substrate; forming an insulation film for field isolation to fill up the trench; removing the pad nitride film; partially etching the insulation film for field isolation while removing the spacers and the screen oxide film, forming a field isolation film; and oxidizing the overall structure including the field isolation film, forming a tunnel oxide film.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Figure 1:
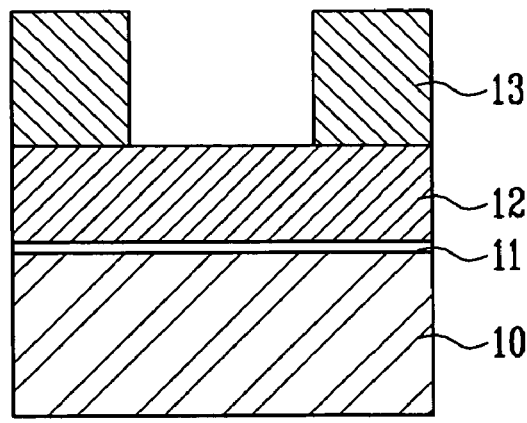
FIGS. 1 through 11 are sectional diagrams illustrating processing steps by a method for manufacturing a flash memory device in accordance with a preferred embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

FIGS. 1 through 11 are sectional diagrams illustrating processing steps by a method for manufacturing a flash memory device in accordance with a preferred embodiment of the present invention. Here, like reference numerals refer to like elements throughout FIGS. 1 to 11 in the specification.

Referring to FIG. 1, a semiconductor substrate 10 is provided after passing through a pre-cleaning process. The pre-cleaning process may be carried out with SC-1 ($NH_4OH/H_2O_2/H_2O$) after cleaning the substrate by diluted HF (DHF), or with SC-1 after cleaning the substrate by a buffered oxide etchant (BOE), in sequence.

And then, a screen oxide film 1 is deposited on the semiconductor substrate 10. During this, the screen oxide film 11 is formed thinner than 80 Å by way of a wet or dry oxidation. For instance, the screen oxide film 11 is controlled to be under 50 Å before depositing a pad nitride film 12 in the following step.

Thereafter, ion implantation processes for well and threshold voltage are conducted with using the screen oxide film 11 as a mask, forming well regions (not shown) in the semiconductor substrate 10.

Next, the pad nitride film 12 is deposited on the screen oxide film 11. During this, it is preferred for the pad nitride film 11 to be formed as thin as possible less than 600 Å with an aspect ratio for which an high density plasma (HDP) oxide film (refer to the reference numeral '18' of FIG. 8) to be used as an insulation film for field isolation completely fills up (gap-filling) the trench (refer to the reference numeral '16' of FIG. 6) by means of low plasma chemical vapor deposition (LPCVD).

And then, after depositing a photoresist film on the pad nitride film 12, exposing and developing processes are conducted with a photomask in sequence, forming a photoresist pattern 13.

Figure 2:
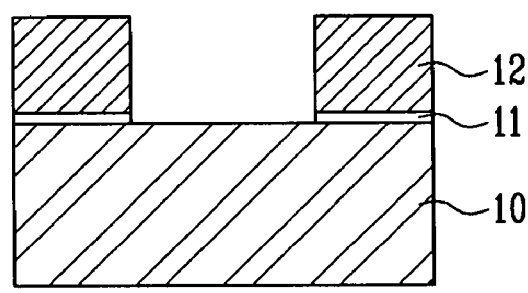

Referring to FIG. 2, an etching process with the photoresist pattern 13 is carried out to pattern the pad nitride film 12 and the screen oxide film 11. As a result, the top surface of the semiconductor substrate 10 is disclosed. After then, the photoresist pattern 13 is removed therefrom by a striping process.

Figure 3:
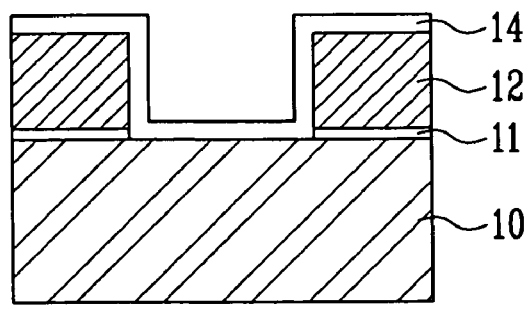

Referring to FIG. 3, an insulation film 14 for spacer is deposited on the disclosed top surface of the semiconductor substrate 10, along step topology therein, where the trench 16 will be formed. The insulation film 14 is formed in the thickness of 50 through 200 Å with using DCS-HTO (dichlorosilane, $SiH_2Cl_2$-high temperature oxide) having good step coverage. Further, the insulation film 14 may be formed by using TEOS (tetra ethyle ortho silicate), MS ($SiH_4$)-HTO, and so on.

Figure 4:
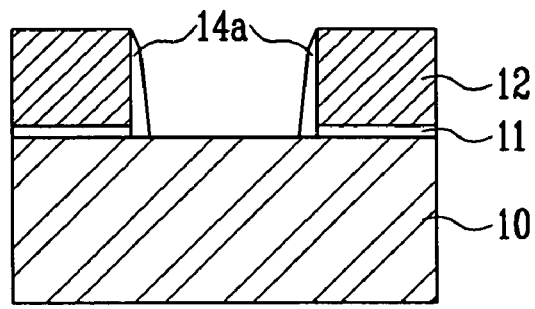

Referring to FIG. 4, an etching process such an etch-back is conducted for the entire surface of the overall structure, resulting in spacers 14a on sidewalls of the patterned pad nitride film 12 and screen oxide film 11. Here, the reason of forming the spacers 14a is because there is a limit to control a width of the trench 16 narrower due to the limitations of etching equipment. Thus, the spacers 14a overcome the limitations of the etching equipment.

Figure 5:
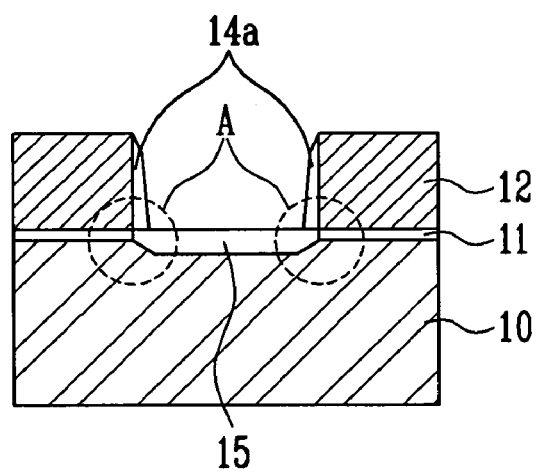

Referring to FIG. 5, an oxidation process is carried out on the top surface of the semiconductor substrate 10, which is disclosed by the spacers 14a, forming a surface oxide film 15 on the top surface of the semiconductor substrate 10 and under the spacers 14a. During this, the oxidation is conducted in the target of thickness that is 30 through 200 Å by means of a wet or dry type. As illustrated in FIG. 5, the surface oxide film 15 is formed with different thickness on the top surface of the semiconductor substrate 10, which is disclosed by the spacers 14a, and under the spacers 14a. As a result, the surface oxide film 15 is shaped into the pattern of bird's beak (refer to 'A') under the spacers 14a. Here, a width of the bird's beak is 100 through 200 Å. And, such bird's beak portions act as basic constructions of slopes at top corners of the trenches.

Figure 6:
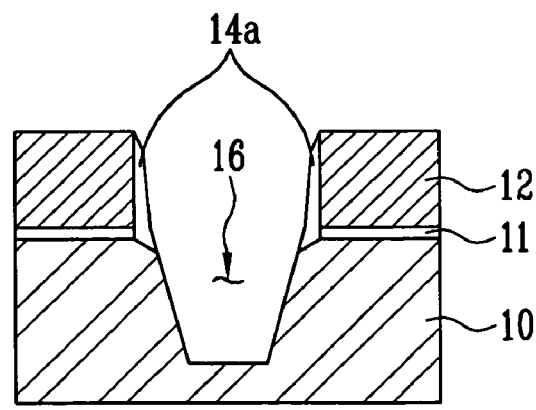

Referring to FIG. 6, a trench etching process is carried out on the region defined as a field area. During this, the trench etching process is conducted with a mask of the spacers 14a, resulting in the trench 16 in the semiconductor substrate 10 disclosed by way of the spacers 14a. Here, a width of the trench 16 is defined by the spacers 14a, being controlled to have its higher width in about 10 nm.

Figure 7:
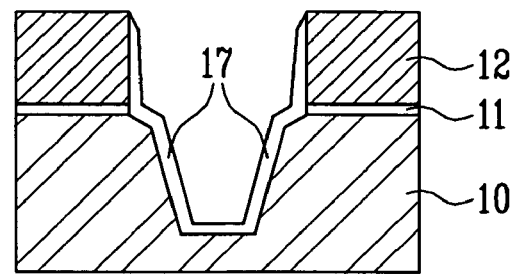

Referring to FIG. 7, a wall oxidation process is carried out on the inner sidewall of the trench, forming a wall oxide film 17. During this, the wall oxidation process is directed to deposit the wall oxide film in the thickness of 30 through 100 Å at temperature of 800 through 1000° C. by means of a dry type. The wall oxidation process is provided to assure a critical dimension for the narrow active region and to offer an enough slope through additional oxidation at the top corners of the trench 16.

Figure 8:
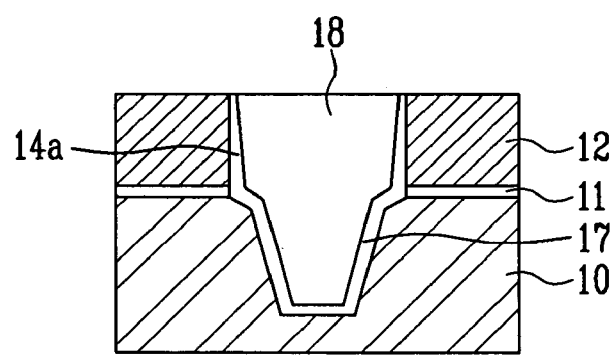

Referring to FIG. 8, an insulation film 18 for field isolation is deposited to fill up the trench 16 for gap-filling. During this, the insulation film 18 is deposited not to generate a void in the trench 16 by using an HDP oxide.

And then, a planarization process is carried out to flatten the top surface of the overall structure where the insulation film 18 is deposited. During this, the planarization process is conducted by means of CMP until the pad nitride film 12 is disclosed. Also in this step, the pad nitride film 12 may be partially polished. In any case, it is available to control the thickness by partially polishing the pad nitride film 12.

Figure 9:
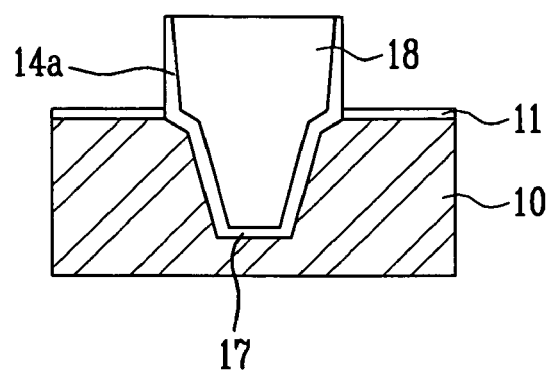

Referring to FIG. 9, the pad nitride film 12 is removed by way of a striping process. During this, the striping process is conducted with using an etchant having a high etch ratio between oxide and nitride. For example, the striping process may be conducted with phosphoric acid ($H_3PO_4$). As a result, the insulation film 18 is figured out in a protruded pattern.

Figure 10:
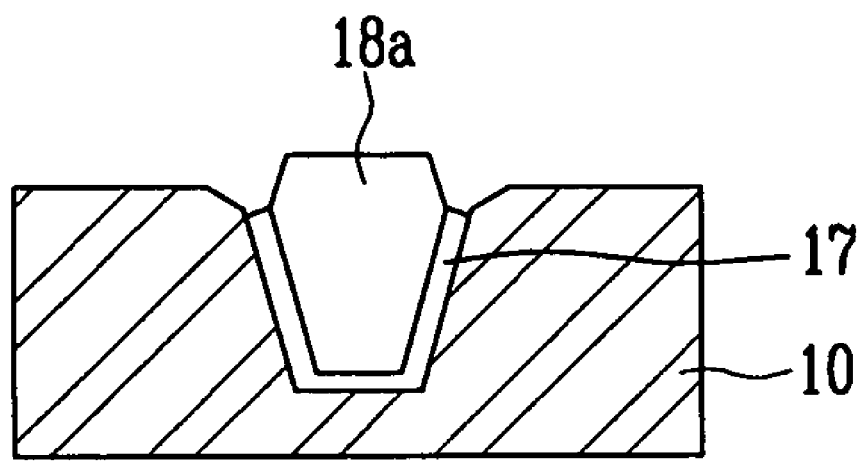

Referring to FIG. 10, a cleaning process with DHF or BOE is carried out to partially etch away the insulation film 18, as well as removing the screen oxide film 11 and the spacers 14a, resulting in a field isolation film 18a.

Figure 11:
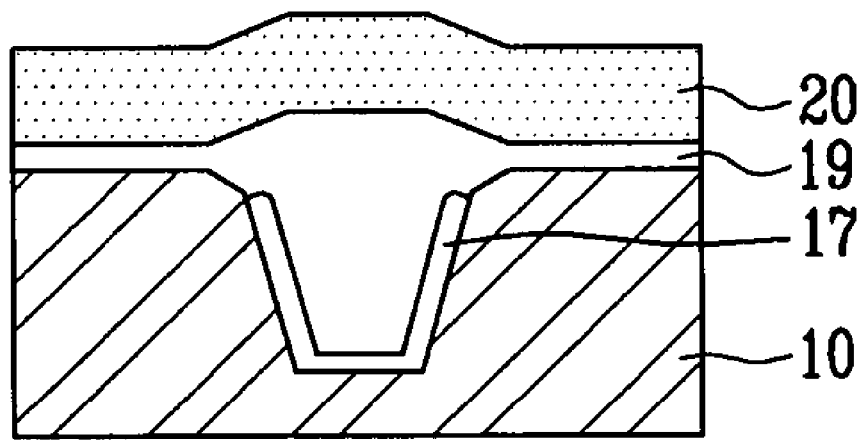

Referring to FIG. 11, a tunnel oxide film 19 is deposited on the overall structure where the field isolation film 18a. During this, the tunnel oxide film 19 is formed by way of an in-situ annealing process with $N_2O$ in temperature of 850 through 1000° C. after conducting a wet oxidation process in temperature of 750 through 800° C. This processing step is provided to form a high quality tunnel oxide film by incorporating nitrogen into the tunnel oxide film 19 with an appropriate amount. Here, the content of nitrogen in the tunnel oxide film 19 is regulated in 2 through 10 atomic %.

Next, a polycrystalline silicon film 20 for floating gate is deposited on the tunnel oxide film 19. During this, the polycrystalline silicon film 20 may be formed of an undoped or doped polycrystalline silicon film. The undoped polycrystalline silicon film is formed with using $SiH_4$ or $Si_2H_6$ gas as a source gas. The doped polycrystalline silicon film may be formed by means of LPCVD with $SiH_4$ gas or a compound gas of $Si_2H_6$ and $PH_3$ in temperature of 510 through 550° C. under pressure of 0.1 through 0.3 torr.

Figure 12:
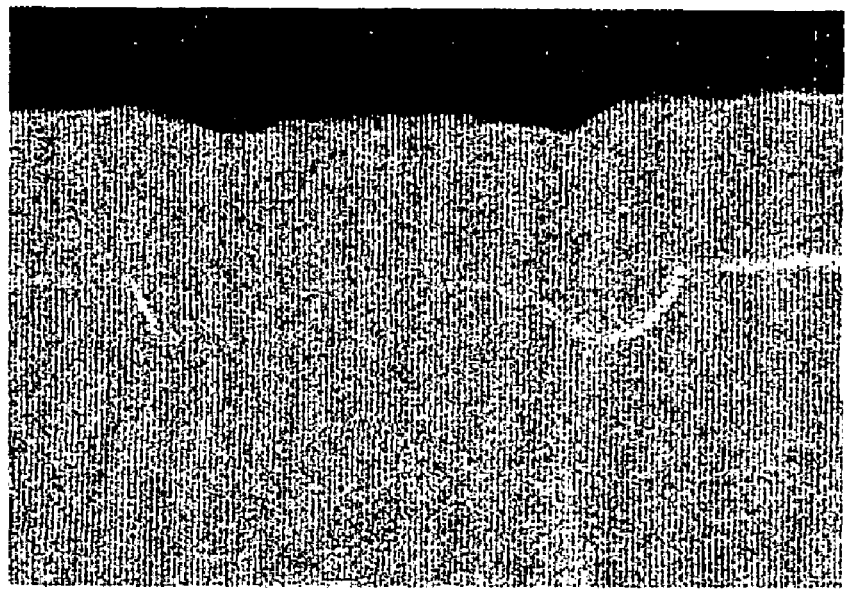
FIG. 12 is a view of scanning electron microscope (SEM) showing a section of a flash memory device manufactured by a shallow trench isolation (STI) process according to a conventional art.
Figure 13:
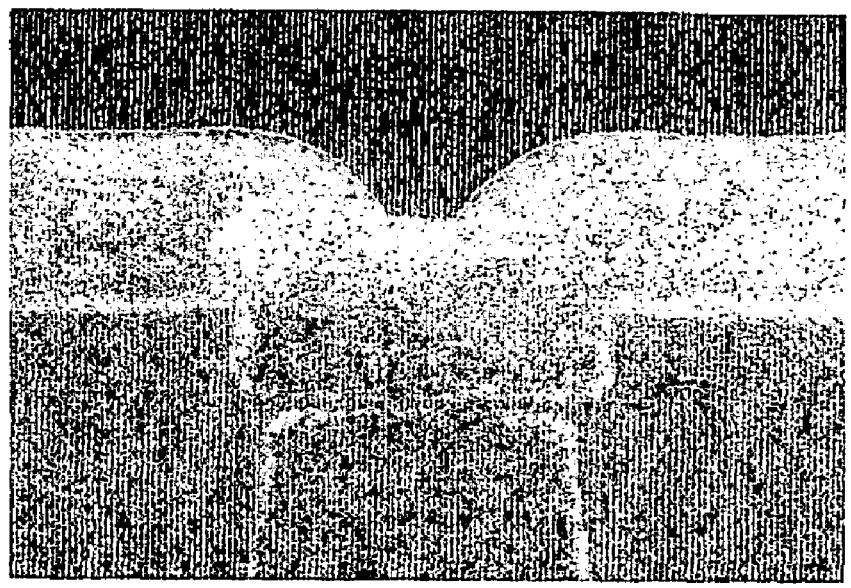
FIG. 13 is a view of scanning electron microscope (SEM) showing a section of a flash memory device manufactured by the method according to the preferred embodiment of the present invention.

A flash memory device manufactured by the aforementioned method according to the preferred embodiment of the present invention is illustrated in FIG. 13. Comparing the feature of FIG. 13 to that of FIG. 12, it can be seen that while the flash memory device manufactured by the conventional method is configured with the feature that the tunnel oxide film is noticeably thin at the top corners of the trench as shown in FIG. 12, the tunnel oxide film 19 is prevented from being thinner at the top corners of the trench 16, which is formed by the method of the present invention, as shown in FIG. 13.

As stated above, the method by the present invention is advantageous to minimizing a trench width, for which after forming spacers on sidewalls of patterned pad nitride and screen oxide films, the trench is formed through a trench etching process with using the spacers as a mask.

Further, the method of the present invention is effective in preventing a tunnel oxide film from being thinner while reducing a critical dimension of an active region, for which a surface oxide film is formed in the pattern of bird's beak with an appropriate width by conducting an oxidation process on a semiconductor substrate before the trench etching process.

Moreover, the method according to present invention is efficient to manufacture a semiconductor memory device with low cost and high reliability, by means of conventional equipment and processing techniques, without complicated processes and additional apparatuses for fabrication.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A method for manufacturing a flash memory device, the method comprising:
    (a) providing a semiconductor comprising a screen oxide film is formed;
    (b) performing an ion implantation process for a well and a threshold voltage;
    (c) forming a pad nitride film on the screen oxide film;
    (d) patterning the pad nitride film and the screen oxide film to partially expose the semiconductor substrate;

(e) forming spacers on sidewalls of the patterned pad nitride and screen oxide films before forming a trench;

(f) oxidizing the exposed semiconductor substrate between the spacers to form a surface oxide film having two sides on the exposed top surface of the semiconductor substrate and under the spacers;

(g) etching the surface oxide film and the semiconductor substrate exposed between the spacers to form a trench in the semiconductor substrate, wherein the surface oxide film remains under the spacer after etching the surface oxide film;

(h) forming an insulation film for field isolation to fill up the trench;

(i) removing the pad nitride film;

(j) partially etching the insulation film for field isolation while removing the spacers and the screen oxide film to form a field isolation film; and (k) oxidizing the overall structure including the field isolation film, thereby forming a tunnel oxide film, wherein the surface oxide film is formed after forming the spacers.

2. The method as set forth in claim 1, wherein the surface oxide film is shaped in a bird's beak at both sides of the surface oxide film.

3. The method as set forth in claim 1, wherein the surface oxide film is thicker on the top surface of the semiconductor substrate than under the spacers.

4. The method as set forth in claim 2, wherein a width of the bird's beak is 100 Å through 200 Å.

5. The method as set forth in claim 1, the surface oxide film to a thickness of 30 Å to 200 Å.

6. The method as set forth in claim 1, further comprising forming a wall oxide film on an inner sidewall of the trench after forming the trench and before forming the insulation film for field isolation to fill the trench.

7. The method as set forth in claim 1, wherein the spacer comprises an insulation film.

8. The method as set forth in claim 7, wherein the insulation film comprises one of DCS-HTO (dichlorosilane, $SiH_2$—$Cl_2$ high temperature oxide), TEOS (tetraethyl orthosilicate), and MS-HTO (monosilane-high temperature oxide).

9. The method as set forth in claim 1, comprising forming the tunnel oxide film by an in-situ annealing process with $N_2O$ at a temperature of 850° C. through 1000° C. after conducting a wet oxidation in temperature of 50° C. through 800° C.

10. The method as set forth in claim 1, wherein the tunnel oxide film contains 2 atomic % through 10 atomic % nitrogen.

* * * * *